United States Patent

Lee

(10) Patent No.: US 8,325,546 B2
(45) Date of Patent: Dec. 4, 2012

(54) METHOD AND SYSTEM FOR PROCESSING A REPAIR ADDRESS IN A SEMICONDUCTOR MEMORY APPARATUS

(75) Inventor: Sang Kyu Lee, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 154 days.

(21) Appl. No.: 12/982,965

(22) Filed: Dec. 31, 2010

(65) Prior Publication Data

US 2012/0020175 A1  Jan. 26, 2012

(30) Foreign Application Priority Data

Jul. 26, 2010  (KR) .................. 10-2010-0072035

(51) Int. Cl.
*G11C 29/00* (2006.01)
(52) U.S. Cl. ............... 365/200; 365/189.05; 365/189.07
(58) Field of Classification Search .................. 365/200, 365/189.05, 189.07
See application file for complete search history.

(56) References Cited

U.S. PATENT DOCUMENTS

| 6,272,056 B1 * | 8/2001 | Ooishi ................... 365/189.18 |
| 6,956,769 B2 | 10/2005 | Lee |
| 7,426,141 B2 | 9/2008 | Takeuchi |
| 2002/0012270 A1 | 1/2002 | Taura et al. |
| 2002/0024859 A1 * | 2/2002 | Ooishi ......................... 365/200 |
| 2003/0016570 A1 * | 1/2003 | Nakahara et al. ............ 365/200 |
| 2005/0099857 A1 | 5/2005 | Yuan et al. |
| 2006/0092725 A1 * | 5/2006 | Min et al. ..................... 365/200 |

FOREIGN PATENT DOCUMENTS

| JP | 2003-109380 | 4/2003 |
| KR | 1020080078998 A | 8/2008 |
| KR | 1020090013620 A | 2/2009 |

* cited by examiner

*Primary Examiner* — Tuan T. Nguyen
(74) *Attorney, Agent, or Firm* — William Park & Associates, Ltd.

(57) ABSTRACT

A semiconductor memory apparatus includes a memory device having a first plane and a second plane and a repair address latch unit configured to latch a plurality of repair addresses outputted from the memory device. The apparatus also includes an address comparison unit configured to compare the plurality of repair addresses stored in the repair address latch unit and a first plane address and a second plane address which are sequentially inputted. A repair processing unit is configured to selectively activate corresponding memory cell groups of the first plane and the second plane in conformity with the comparison result of the address comparison unit under the control of a first plane signal, a second plane signal and a start pulse signal.

20 Claims, 3 Drawing Sheets

METHOD AND SYSTEM FOR PROCESSING A REPAIR ADDRESS IN A SEMICONDUCTOR MEMORY APPARATUS

CROSS-REFERENCES TO RELATED APPLICATION

The present application claims priority under 35 U.S.C. §119(a) to Korean application number 10-2010-0072035, filed on Jul. 26, 2010, in the Korean Intellectual Property Office, which is incorporated herein by reference in its entirety.

BACKGROUND

1. Technical Field

The present invention generally relates to a semiconductor memory apparatus, and more particularly, to a method and system for processing a repair address in a semiconductor memory apparatus.

2. Related Art

A flash memory apparatus is a kind of nonvolatile memory apparatus that includes a configuration information storage block for storing configuration data. The configuration information storage block is assigned to a specified block of a memory device and is composed of a plurality of nonvolatile memory cells. For reference, such a configuration information storage block is called a code address memory (CAM).

Since a flash memory apparatus may have bad memory cells, spare memory cells are used in place of the bad memory cells. Accordingly, addresses for the bad memory cells are mapped to spare memory cells. In this way, a flash memory apparatus need not be wasted because a few memory cells are bad. Memory cells may be tested as part of manufacturing process to determine which memory cells are bad. Memory cells may also be tested and flagged as bad by an application program after the manufacturing process.

Each of the plurality of configuration data, which are stored in the configuration information storage block, includes any one of internal bias information, internal logic configuration information, repair address information, and redundancy information. Repair address information may be used to point to spare memory cells to be used in place of bad memory cells. The specific number of memory cells disabled and mapped to spare memory cells due to a specific bad memory cell may be design dependent.

Initialization is performed during a power-up period in a nonvolatile memory apparatus. Part of the initialization comprises a page buffer detecting and outputting the configuration data stored in the configuration information storage block. At this time, if repair addresses are part of the configuration data, the repair addresses are stored in a repair address latch unit.

A memory device of the nonvolatile memory apparatus can be divided into a plurality of planes. Each plane includes memory blocks and the page buffer. The respective planes operate independently of one another. In general, the plurality of planes are configured in such a manner that they are sequentially activated (or selected) and operated.

SUMMARY

In one embodiment of the present invention, a semiconductor memory apparatus includes a memory device having a first plane and a second plane; a repair address latch unit configured to store a plurality of repair addresses corresponding to the first plane and the second plane; an address comparison unit configured to compare the plurality of repair addresses from the repair address latch unit and a first plane address and a second plane address which are sequentially inputted, and output a comparison result; and a repair processing unit configured to selectively activate corresponding memory cell groups of the first plane and the second plane in conformity with the comparison result of the address comparison unit under the control of a first plane signal, a second plane signal and a start pulse signal.

In another embodiment of the present invention, a semiconductor memory apparatus includes an address comparison unit configured to compare repair addresses with a first plane address and a second plane address, which are sequentially inputted, and output a comparison result; and a repair processing unit configured to selectively activate a first plane memory cell group enable signal and a second plane memory cell group enable signal in conformity with the comparison result of the address comparison unit, under the control of a first plane signal, a second plane signal, and a start pulse signal.

In another embodiment of the present invention, a method for repair-processing a semiconductor memory apparatus, to which a first plane address and a second plane address are sequentially inputted, includes the steps of comparing the first plane address and repair addresses and output a first comparison result; generating a first plane memory cell group enable signal, which is selectively asserted in conformity with the first comparison result, under the control of a first plane signal and a start pulse signal; comparing the second plane address and the repair addresses and output a second comparison result; and generating a second plane memory cell group enable signal, which is selectively asserted in conformity with the second comparison result, under the control of a second plane signal and the start pulse signal.

BRIEF DESCRIPTION OF THE DRAWINGS

Features, aspects, and embodiments are described in conjunction with the attached drawings, in which.

DETAILED DESCRIPTION

Hereinafter, method and system for processing a repair address in a semiconductor memory apparatus according to the present invention will be described below with reference to the accompanying drawings through exemplary embodiments.

The term "latch" as a noun refers generally to an edge-triggered device or a level-triggered device. The term "latch" as a verb refers to storing data in a latch.

For reference, since terms, symbols, and signs that are used in drawings and in this detailed description to designate devices, blocks, and so on may be used for detailed units as the occasion demands, it is to be noted that the same terms, symbols, and signs may not designate the same devices, blocks, and so on in an entire circuitry. In general, the logic signals of a circuit and binary data values are divided into a high level (H) and a low level (L) in correspondence to voltage levels and may be represented as '1' and '0'. Furthermore, as the occasion demands, a high impedance state (a high-Z state) may be defined and described. An "active high" signal is defined as a signal that is "H" or "1" when asserted, and an "active low" signal is defined as a signal that is "L" or "0" when asserted.

Figure 1:
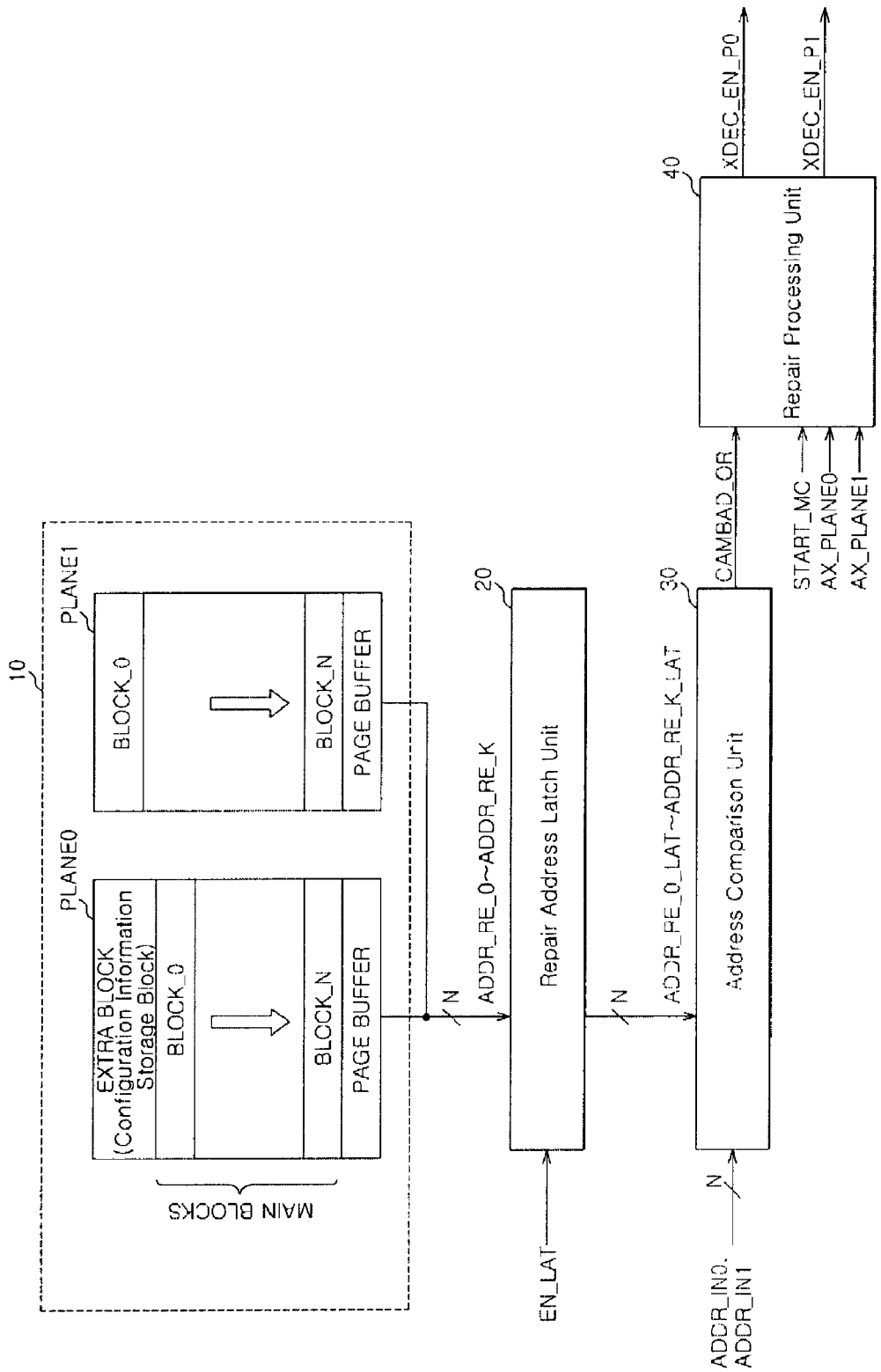
FIG. 1 is a configuration diagram of a semiconductor memory apparatus in accordance with an embodiment of the present invention.

FIG. 1 is a configuration diagram of a semiconductor memory apparatus in accordance with an embodiment of the present invention.

The semiconductor memory apparatus in accordance with a present embodiment of the invention includes only a simplified configuration for the sake of clear description.

Referring to FIG. 1, a semiconductor memory apparatus includes a memory device 10, a repair address latch unit 20, an address comparison unit 30, and a repair processing unit 40.

The detailed configuration and principal operations of the semiconductor memory apparatus configured as mentioned above will be described below.

The memory device 10 is divided into a first plane PLANE0 and a second plane PLANE1.

Each of the first and second planes PLANE0 and PLANE1 includes main storage blocks BLOCK_0 through BLOCK_N, an extra storage block EXTRA BLOCK, and a page buffer PAGE BUFFER. Each of the main storage blocks BLOCK_0 through BLOCK_N is divided into a plurality of pages, and each page is composed of a plurality of memory cells. The extra storage block EXTRA BLOCK includes a configuration information storage block for storing a plurality of repair addresses. The configuration information storage block is divided into a plurality of pages, and each page is composed of a plurality of memory cells. The page buffer PAGE BUFFER detects and outputs data which are stored in the configuration information storage block and the main storage blocks BLOCK_0 through BLOCK_N. In the present embodiment, a configuration information storage block for storing a plurality of repair addresses ADDR_RE_0 through ADDR_RE_K is included in the first plane PLANE0.

For reference, the plurality of repair addresses ADDR_RE_0 through ADDR_RE_K, which are stored in the configuration information storage block, include all the repair addresses corresponding to the first plane PLANE0 and the repair addresses corresponding to the second plane PLANE1. The number of repair addresses corresponding to each plane can be controlled as the occasion demands. In other words, in the event that bad memory cells exist more in the first plane PLANE0, more of the repair addresses can be allocated to the first plane PLANE0 than to the second plane PLANE1.

The repair address latch unit 20 is configured to latch the plurality of repair addresses ADDR_RE_0 through ADDR_RE_K which are outputted from the memory device 10.

The address comparison unit 30 is configured to compare the repair addresses ADDR_RE_0 through ADDR_RE_K which are stored in the repair address latch unit 20 and a first plane address ADDR_IN0 and a second plane address ADDR_IN1 which are sequentially inputted. If one of the first plane address ADDR_IN0 or the second plane address ADDR_IN1 matches one of the repair addresses ADDR_RE_0 through ADDR_RE_K, a comparison result signal CAMBAD_OR is asserted. In the present embodiment, the address comparison unit 30 outputs the comparison result CAMBAD_OR to a high level when the first plane address ADDR_IN0 or the second plane address ADDR_IN1 is the same as one of the repair addresses ADDR_RE_0_LAT through ADDR_RE_K_LAT.

The repair processing unit 40 is configured to selectively activate corresponding memory cell groups of the first plane PLANE0 and the second plane PLANE1 in conformity with a comparison result of the address comparison unit 30 under the control of a first plane signal AX_PLANE0, a second plane signal AX_PLANE1 and a start pulse signal START_MC. The first plane signal AX_PLANE0 is a signal which is asserted when the first plane address ADDR_IN0 is inputted, the second plane signal AX_PLANE1 is a signal which is asserted when the second plane address ADDR_IN1 is inputted, and the start pulse signal START_MC is a signal which pulses each time after each plane address is inputted. For reference, the first plane signal AX_PLANE0, the second plane signal AX_PLANE1 and the start pulse signal START_MC can be defined as signals which are outputted from an internal control logic (not shown) and a command logic (not shown).

Figure 2:
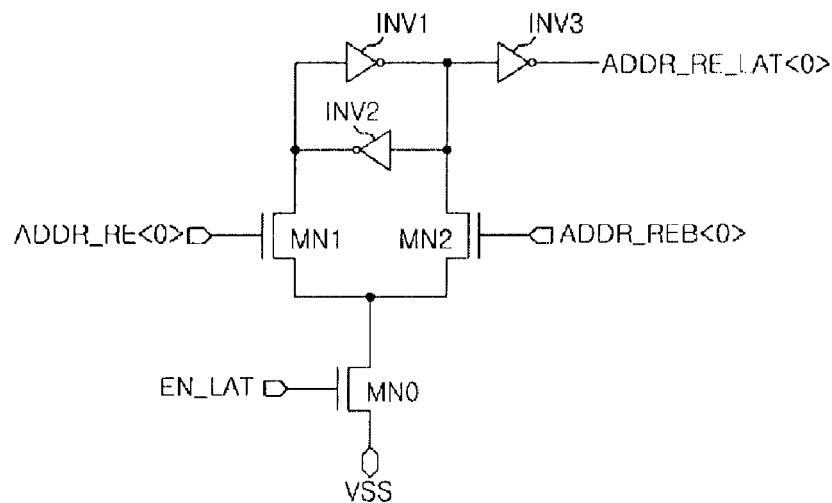
FIG. 2 is a circuit diagram illustrating an embodiment of a repair address latch unit shown in FIG. 1.

FIG. 2 is a circuit diagram illustrating an embodiment of the repair address latch unit 20 shown in FIG. 1.

FIG. 2 representatively shows one of a plurality of cross-couple type latches which constitute the repair address latch unit 20.

Referring to FIG. 2, a cross-couple type latch is configured to detect and latch repair addresses ADDR_RE<0> and ADDR_REB<0>, which are outputted from the memory device 10, in response to a latch enable signal EN_LAT. In the present embodiment, the cross-couple type latch includes a cross-couple type differential amplification circuit.

Figure 3:
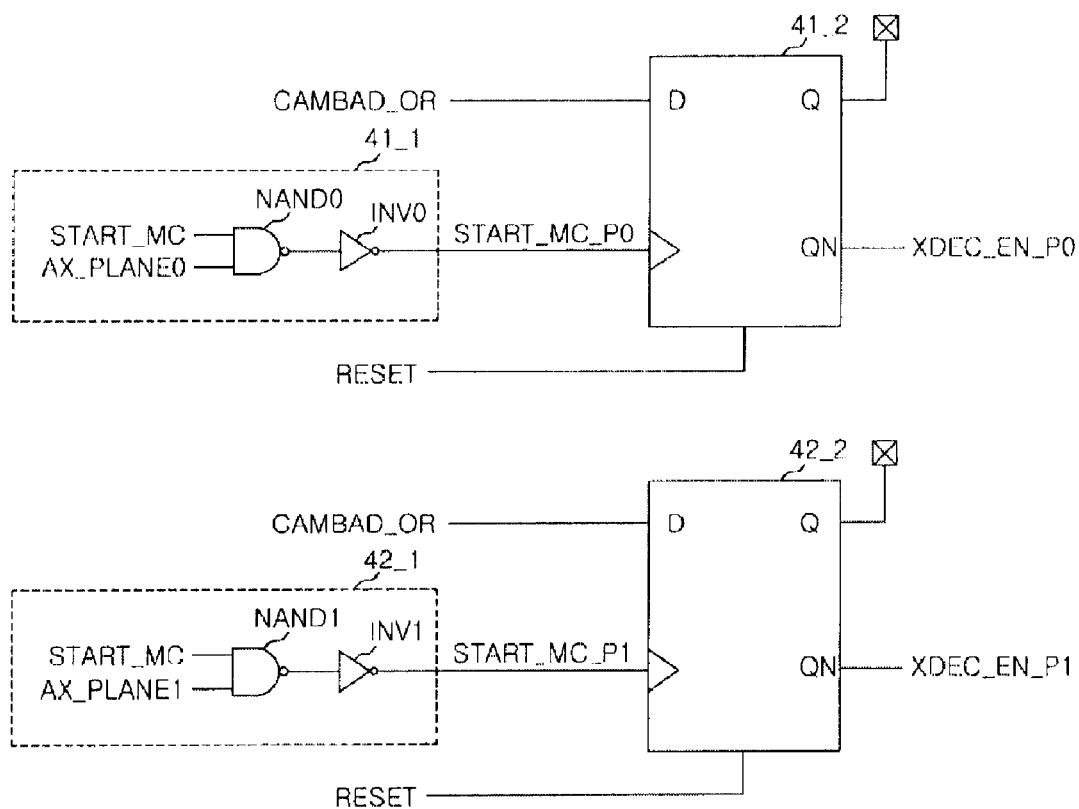
FIG. 3 is a circuit diagram illustrating an embodiment of a repair processing unit shown in FIG. 1.

FIG. 3 is a circuit diagram illustrating an embodiment of the repair processing unit 40 shown in FIG. 1.

Referring to FIG. 3, the repair processing unit 40 includes a first control pulse generation section 41_1, a first latch section 41_2, a second control pulse generation section 42_1 and a second latch section 42_2.

The first control pulse generation section 41_1 is configured to generate a first control pulse signal START_MC_P0 which pulses for a predetermined period, in response to the first plane signal AX_PLANE0 and the start pulse signal START_MC. In the present embodiment, the first control pulse generation section 41_1 includes first logic parts NAND0 and INV0 used to AND the first plane signal AX_PLANE0 and the start pulse signal START_MC. The first control pulse generation section 41_1 outputs the first control pulse signal START_MC_P0.

The first latch unit 41_2 is configured to latch the comparison result signal CAMBAD_OR outputted from the address comparison unit 30. The first control pulse signal START_MC_P0 is used to latch the comparison result signal CAMBAD_OR, and output of the first latch unit 41_2 is a first plane memory cell group enable signal XDEC_EN_P0.

The second control pulse generation section 42_1 is configured to generate a second control pulse signal START_MC_P1 which pulses for a predetermined period, in response to the second plane signal AX_PLANE1 and the start pulse signal START_MC. In the present embodiment, the second control pulse generation section 42_1 includes second logic parts NAND1 and INV1 used to AND the second plane signal AX_PLANE1 and the start pulse signal START_MC. The second control pulse generation section 41_2 outputs the second control pulse signal START_MC_P1.

The second latch unit 42_2 is configured to latch the comparison result signal CAMBAD_OR outputted from the address comparison unit 30. The second control pulse signal START_MC_P1 is used to latch the comparison result signal CAMBAD_OR, and output of the of the second latch unit 42_2 is a second plane memory cell group enable signal XDEC_EN_P1.

Accessing the spare memory cells is design dependent. For example, the spare addresses mapped to the repair addresses may be downloaded as a part of the configuration information. Accordingly, the spare addresses may be stored, for example, in the repair address latch unit 20 and output when the first plane address ADDR_IN0 or the second plane address ADDR_IN1 matches one of the repair addresses.

Figure 4:
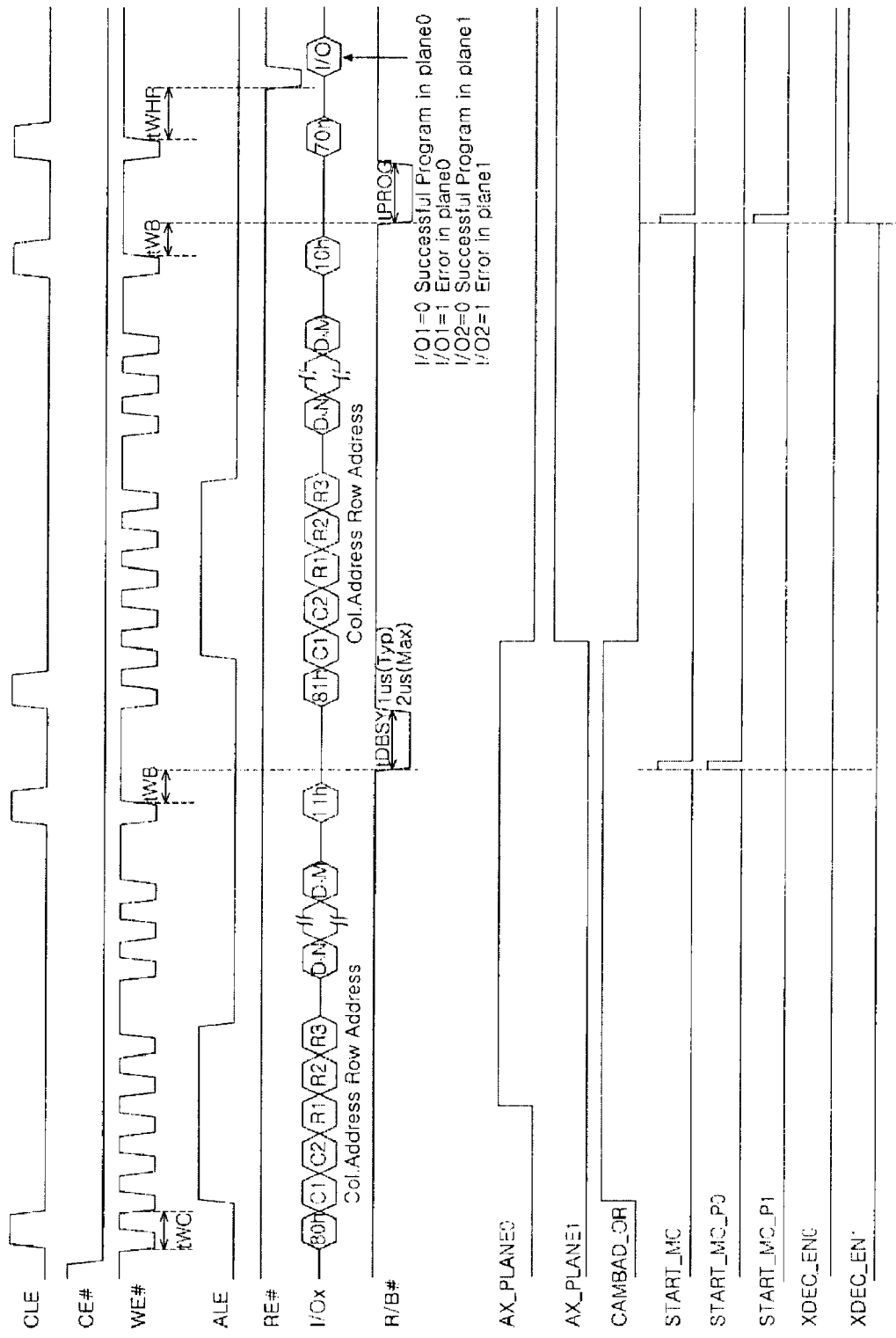
FIG. 4 is a timing diagram illustrating internal operations of a semiconductor memory apparatus in accordance with the embodiment of the present invention.

FIG. 4 is a timing diagram illustrating internal operations of a semiconductor memory apparatus in accordance with an embodiment of the present invention.

Principal internal operations of the semiconductor memory apparatus in accordance with the embodiment of the present invention will be described below with reference to the timing diagram of FIG. 4 along with FIGS. 1 through 3.

First, when the first plane address ADDR_IN0 is inputted through an address channel I/Ox, the first plane signal AX_PLANE0 is asserted to a high level. At this time, the address comparison unit 30 compares the first plane address and the repair addresses and outputs a comparison result as the comparison result signal CAMBAD_OR. In the present embodiment, since the first plane address and the repair addresses correspond to each other, the comparison result signal CAMBAD_OR of the high level is outputted.

Because the start pulse signal START_MC pulses to a high level after the first plane address is inputted, the first control pulse signal START_MC_P0 is also outputted to a high level by the first plane signal AX_PLANE0 of the high level and the start pulse signal START_MC of the high level. The first latch section 41_2 latches again the comparison result signal CAMBAD_OR when the first control pulse signal START_MC_P0 has the high level, and therefore, the first plane memory cell group enable signal XDEC_EN_P0 is outputted to a low level. That is to say, the first plane memory cell group enable signal XDEC_EN_P0 is outputted to a level opposite to the comparison result signal CAMBAD_OR.

Next, when the second plane address is inputted through the address channel I/Ox, the second plane signal AX_PLANE1 is asserted to a high level. At this time, the address comparison unit 30 compares the second plane address and the repair addresses and outputs a comparison result as the comparison result signal CAMBAD_OR. In the present embodiment, since the second plane address and the repair addresses are different from each other, the comparison result signal CAMBAD_OR of a low level is outputted.

Because the start pulse signal START_MC pulses again to the high level after the second plane address is inputted, the second control pulse signal START_MC_P1 is also outputted to a high level by the second plane signal AX_PLANE1 of the high level and the start pulse signal START_MC of the high level. The second latch section 42_2 latches again the comparison result signal CAMBAD_OR when the second control pulse signal START_MC_P1 has the high level, and therefore, the second plane memory cell group enable signal XDEC_EN_P1 is outputted to a high level. That is to say, the second plane memory cell group enable signal XDEC_EN_P1 is outputted to a level opposite to the comparison result signal CAMBAD_OR.

In the semiconductor memory apparatus in accordance with the embodiment of the present invention, the number of repair addresses corresponding to the first plane PLANE0 and the number of repair addresses corresponding to the second plane PLANE1 can be controlled as the occasion demands. Namely, the distribution of the repair addresses corresponding to the first plane PLANE0 and the second plane PLANE1 can be controlled within a range in which the repair address latch unit 20 can store repair addresses.

In other words, in the event that failed memory cells exist more in the first plane PLANE0, more of the repair addresses corresponding to the first plane PLANE0 can be stored in the configuration information storage block. That is to say, since the repair processing unit 40 can selectively activate the corresponding memory cell groups of the first plane PLANE0 and the second plane PLANE1, the distribution numbers of the repair addresses corresponding to the first plane PLANE0 and the second plane PLANE1 can be freely controlled.

As can be readily seen from the above description, a method for repair-processing a semiconductor memory apparatus, to which a first plane address and a second plane address are sequentially inputted, includes comparing the first plane address and repair addresses and outputting a first comparison result. A first plane memory cell group enable signal may be asserted in conformity with the first comparison result, under the control of a first plane signal and a start pulse signal.

Similarly, the second plane address and the repair addresses may be compared and a second comparison result may be output. A second plane memory cell group enable signal may be asserted in conformity with the second comparison result, under the control of a second plane signal and the start pulse signal.

So far, embodiments of the present invention have been described in detail. For reference, embodiments including additional component elements, which are not directly associated with the technical spirit of the present invention, may be exemplified in order to describe the present invention in further detail. For example, various embodiments of the invention may be used for semiconductor memory apparatus that have more than two planes. Additionally, the extra storage block EXTRA BLOCK may be present in more than one plane. Moreover, an active high configuration or an active low configuration for indicating the asserted states of signals and circuits may vary depending upon an embodiment. Since such embodiment changes have a large number of cases and can be easily inferred by those skilled in the art, the enumeration thereof will be omitted herein.

While certain embodiments have been described above, it will be understood to those skilled in the art that the embodiments described are by way of example only. Accordingly, the processing of a repair address in a semiconductor memory apparatus described herein should not be limited based on the described embodiments. Rather, the processing of a repair address in a semiconductor memory apparatus described herein should only be limited in light of the claims that follow when taken in conjunction with the above description and accompanying drawings.

What is claimed is:

1. A semiconductor memory apparatus comprising:
   a memory device having a first plane and a second plane;
   a repair address latch unit configured to store a plurality of repair addresses corresponding to the first plane and the second plane;
   an address comparison unit configured to compare the plurality of repair addresses from the repair address latch unit and a first plane address and a second plane address which are sequentially inputted, and output a comparison result; and
   a repair processing unit configured to selectively activate corresponding memory cell groups of the first plane and the second plane in conformity with the comparison result of the address comparison unit, under the control of a first plane signal, a second plane signal, and a start pulse signal.

2. The semiconductor memory apparatus according to claim 1, wherein the repair latch unit is configured to store the repair addresses for the first plane and the repair addresses for the second plane.

3. The semiconductor memory apparatus according to claim 1, wherein the first plane signal is asserted when the first plane address is inputted, the second plane signal is asserted when the second plane address is inputted, and the start pulse signal is a signal which pulses after any one of the first plane address and the second plane address is inputted.

4. The semiconductor memory apparatus according to claim 1, wherein the plurality of repair addresses are loaded from a configuration information storage block, configured to store the plurality of repair addresses, in the memory device.

5. The semiconductor memory apparatus according to claim 4, wherein the configuration information storage block is in at least one of the first and second planes.

6. The semiconductor memory apparatus according to claim 5, wherein the configuration information storage block is divided into a plurality of pages, and each page comprises a plurality of nonvolatile memory cells.

7. The semiconductor memory apparatus according to claim 5, wherein each of the first and second planes comprises:
a main storage block; and
a page buffer configured to detect and output data stored in the configuration information storage block and the main storage block.

8. The semiconductor memory apparatus according to claim 7, wherein the main storage block is divided into a plurality of pages, and each page comprises a plurality of nonvolatile memory cells.

9. The semiconductor memory apparatus according to claim 1, wherein the repair address latch unit comprises:
a plurality of cross-couple type latches configured to latch the plurality of repair addresses in response to a latch enable signal.

10. The semiconductor memory apparatus according to claim 1, wherein the repair processing unit comprises:
a first control pulse generation section configured to generate a first control pulse signal, which pulses for a predetermined period, in response to the first plane signal and the start pulse signal;
a first latch section configured to latch a comparison result signal, which is outputted from the address comparison unit, under control of the first control pulse signal, and output a first plane memory cell group enable signal;
a second control pulse generation section configured to generate a second control pulse signal, which pulses for a predetermined period, in response to the second plane signal and the start pulse signal; and
a second latch section configured to latch the comparison result signal, under control of the second control pulse signal, and output a second plane memory cell group enable signal.

11. The semiconductor memory apparatus according to claim 10, wherein the first control pulse generation section comprises:
first logic parts configured to AND the first plane signal and the start pulse signal, and output the first control pulse signal.

12. The semiconductor memory apparatus according to claim 10, wherein the second control pulse generation section comprises:
second logic parts configured to AND the second plane signal and the start pulse signal, and output the second control pulse signal.

13. A semiconductor memory apparatus comprising:
an address comparison unit configured to compare repair addresses with a first plane address and a second plane address which are sequentially inputted, and output a comparison result; and
a repair processing unit configured to selectively activate a first plane memory cell group enable signal and a second plane memory cell group enable signal in conformity with the comparison result of the address comparison unit under control of a first plane signal, a second plane signal, and a start pulse signal.

14. The semiconductor memory apparatus according to claim 13, wherein the first plane signal is asserted when the first plane address is inputted, the second plane signal is asserted when the second plane address is inputted, and the start pulse signal pulses each time after each plane address is inputted.

15. The semiconductor memory apparatus according to claim 13, wherein the repair processing unit comprises:
a first control pulse generation section configured to generate a first control pulse signal, which pulses for a predetermined period, in response to the first plane signal and the start pulse signal;
a first latch section configured to latch a comparison result signal, which is outputted from the address comparison unit, under the control of the first control pulse signal, and output the first plane memory cell group enable signal;
a second control pulse generation section configured to generate a second control pulse signal, which pulses for a predetermined period, in response to the second plane signal and the start pulse signal; and
a second latch section configured to latch the comparison result signal, under the control of the second control pulse signal, and output the second plane memory cell group enable signal.

16. The semiconductor memory apparatus according to claim 15, wherein the first control pulse generation section comprises:
first logic parts configured to AND the first plane signal and the start pulse signal, and output the first control pulse signal.

17. The semiconductor memory apparatus according to claim 16, wherein the second control pulse generation section comprises:
second logic parts configured to AND the second plane signal and the start pulse signal, and output the second control pulse signal.

18. A method for repair-processing a semiconductor memory apparatus to which a first plane address and a second plane address are sequentially inputted, comprising:
comparing the first plane address and repair addresses and outputting a first comparison result;
generating a first plane memory cell group enable signal, which is selectively asserted in conformity with the first comparison result, under control of a first plane signal and a start pulse signal;
comparing the second plane address and the repair addresses, and output a second comparison result; and
generating a second plane memory cell group enable signal, which is selectively asserted in conformity with the second comparison result, under control of a second plane signal and the start pulse signal.

19. The method according to claim 18, wherein the first plane signal is asserted when the first plane address is inputted, the second plane signal is asserted when the second plane address is inputted, and the start pulse signal pulses each time after each plane address is inputted.

20. The method according to claim 18, wherein the limit on the number of the repair addresses is for the sum of a number of repair addresses corresponding to the first plane and a number of repair addresses corresponding to the second plane.

* * * * *